US007253498B2

(12) United States Patent
Dutta

(10) Patent No.: US 7,253,498 B2
(45) Date of Patent: Aug. 7, 2007

(54) BIPOLAR TRANSISTOR WITH GEOMETRY OPTIMIZED FOR DEVICE PERFORMANCE, AND METHOD OF MAKING SAME

(75) Inventor: Ranadeep Dutta, Austin, TX (US)

(73) Assignee: Legerity Inc., Austin, TX (US)

(*) Notice: Subject to any disclaimer, the term of this patent is extended or adjusted under 35 U.S.C. 154(b) by 418 days.

(21) Appl. No.: 10/885,250

(22) Filed: Jul. 6, 2004

(65) Prior Publication Data

US 2006/0006498 A1 Jan. 12, 2006

(51) Int. Cl.
*H01L 27/82* (2006.01)

(52) U.S. Cl. ...................... 257/571; 257/566; 257/578; 257/583; 257/591; 257/592

(58) Field of Classification Search ..................... None
See application file for complete search history.

(56) References Cited

U.S. PATENT DOCUMENTS

| | | | | |
|---|---|---|---|---|
| 4,959,699 | A | 9/1990 | Lidow et al. | 357/23 |
| 5,008,725 | A | 4/1991 | Lidow et al. | 357/23.4 |
| 5,130,767 | A | 7/1992 | Lidow et al. | 357/23.4 |
| 6,278,140 | B1 * | 8/2001 | Harada et al. | 257/133 |
| 2001/0026429 | A1 * | 10/2001 | Fukuda et al. | 361/93.9 |
| 2002/0096713 | A1 * | 7/2002 | Magnee et al. | 257/341 |
| 2004/0023463 | A1 * | 2/2004 | Shirakawa | 438/312 |

OTHER PUBLICATIONS

Dutta et al., "Influence of Device Geometry on DC, AC and SOA of High Speed HV Bipolar Transistors".

* cited by examiner

*Primary Examiner*—David Nelms
*Assistant Examiner*—Hoang-Quan Ho
(74) *Attorney, Agent, or Firm*—Williams, Morgan & Amerson, P.C.

(57) ABSTRACT

The present invention is generally directed to bipolar transistors with geometry optimized for device performance and various methods of making same. In one illustrative embodiment, the device includes a substrate, an intrinsic base region formed in the substrate, a continuous emitter region formed within the intrinsic base region, the emitter region having a plurality of substantially hexagonal shaped openings defined therein, and a plurality of extrinsic base regions formed in the substrate, wherein each of the extrinsic base regions is positioned within an area defined by one of the plurality of substantially hexagonal shaped openings.

23 Claims, 7 Drawing Sheets

BIPOLAR TRANSISTOR WITH GEOMETRY OPTIMIZED FOR DEVICE PERFORMANCE, AND METHOD OF MAKING SAME

BACKGROUND OF THE INVENTION

1. Field of the Invention

This invention is generally related to the field of semiconductor devices, and, more particularly, to a bipolar transistor with geometry optimized for device performance and a method of making same.

2. Description of the Related Art

There is a constant drive within the semiconductor industry to increase the operating efficiency and reduce the size of bipolar junction transistors and integrated circuit devices incorporating such transistors. This drive is fueled by demands for electronic devices that operate at increasingly greater speeds, consume less power, and an overall desire for more physically compact devices. Power bipolar transistors are employed in a variety of integrated circuit devices. For example, such power bipolar transistors may be employed in a typical ADSL line driver or in a subscriber line interface card (SLIC) which are in widespread use in the telecommunications industry. Such power bipolar devices may operate in high voltage environments, e.g., 80–150 volts.

As is well known in the art, power bipolar transistors are typically fabricated on a silicon-on-insulator (SOI) substrate. Such power bipolar transistors may occupy a significant portion of the silicon area within a typical ADSL line driver or a typical SLIC, e.g., approximately 40% of the total silicon area. FIG. 1 is a schematic plan view of various implant regions in an illustrative prior art power bipolar transistor 10. As shown therein, the power bipolar transistor 10 has a so-called multiple-stripe layout configuration. The power bipolar transistor 10 may be formed in an active layer of an SOI substrate. The transistor 10 is generally comprised of a collector region 16, a plurality of emitter regions 18, a plurality of extrinsic base regions 20, and an intrinsic base region 22. The intrinsic base region 22 is sometimes referred to as the base box. A trench isolation region 24 surrounds the bipolar transistor 10. The methods of forming such doped regions in the illustrative multiple stripe bipolar transistor are well known to those skilled in the art. Additionally, when the bipolar junction transistor 10 is completed, contacts will be formed to these various doped regions as is known in the art. The particular type of dopant materials, e.g., N-type or P-type, used to form the various doped regions shown in FIG. 1 will vary depending upon the type of device under construction, e.g., an NPN transistor or a PNP transistor. Of course, the precise dopant concentrations of the various doped regions may vary depending on the particular application.

As stated previously, there is a constant drive to reduce the size of such power bipolar junction transistor devices, while at the same time maintaining or enhancing the performance characteristics of such devices. Since multiple stripe power bipolar transistors may occupy approximately 40% of the silicon area of a typical SLIC, optimizing the performance of the power amplifier per unit of silicon area is one viable means for reducing die size. Accordingly, a desire and need exist for a layout geometry for a power bipolar transistor that can eliminate, solve or reduce one or more of the problems identified above. The layout of prior art bipolar junction transistors is also configured so as to avoid or reduce problems associated with current crowding which may result in localized hot spots within such a device. Such current crowding may limit the performance capability of the device and, in some cases, result in device failure. However, in avoiding current crowding problems, such prior art bipolar transistors consume a relatively large amount of silicon area.

The present invention is directed to various devices and methods that may solve, or at least reduce, some or all of the aforementioned problems.

SUMMARY OF THE INVENTION

The present invention is generally directed to various embodiments of a bipolar transistor with the geometry optimized for device performance and various methods of making same. In one illustrative embodiment, the device comprises a substrate, an intrinsic base region formed in the substrate, a continuous emitter region formed within the intrinsic base region, the emitter region having a plurality of substantially hexagonal shaped openings defined therein, and a plurality of extrinsic base regions formed in the substrate, wherein each of the extrinsic base regions is positioned within an area defined by one of the plurality of substantially hexagonal shaped openings.

In another illustrative embodiment, the device comprises a substrate, an intrinsic base region formed in the substrate, a continuous emitter region formed within the intrinsic base region, the emitter region having a plurality of substantially hexagonal shaped openings defined therein, a plurality of substantially hexagonal shaped extrinsic base regions formed in the substrate, wherein each of the substantially hexagonal shaped extrinsic base regions is positioned within an area defined by one of the plurality of substantially hexagonal shaped openings, and at least one conductive contact coupled to the continuous emitter region.

In yet another illustrative embodiment, the device comprises a substrate, an intrinsic base region formed in the substrate, a continuous emitter region formed within the intrinsic base region, the emitter region having a plurality of substantially hexagonal shaped openings defined therein, the continuous emitter region having an approximately constant width between each of the plurality of substantially hexagonal shaped openings, and a plurality of substantially hexagonal shaped extrinsic base regions formed in the substrate, wherein each of the substantially hexagonal shaped extrinsic base regions is positioned within an area defined by one of the plurality of substantially hexagonal shaped openings.

In one illustrative embodiment, the method comprises forming a plurality of extrinsic base regions in a substrate, forming an intrinsic base region in the substrate and forming a continuous emitter region within the intrinsic base region, the emitter region having a plurality of substantially hexagonal shaped openings defined therein, wherein the continuous emitter region is formed such that each of the extrinsic base regions is positioned within an area defined by one of the plurality of substantially hexagonal shaped openings.

In another illustrative embodiment, the method comprises forming a plurality of substantially hexagonal shaped extrinsic base regions in a substrate, forming an intrinsic base region in the substrate and forming a continuous emitter region within the intrinsic base region, the emitter region has a plurality of substantially hexagonal shaped openings defined therein and an approximately constant width between each of the plurality of substantially hexagonal openings, wherein the emitter region is formed such that each of the substantially hexagonal shaped extrinsic base regions is positioned within an area defined by one of the plurality of substantially hexagonal shaped openings.

BRIEF DESCRIPTION OF THE DRAWINGS

The invention may be understood by reference to the following description taken in conjunction with the accompanying drawings, in which like reference numerals identify like elements, and in which.

Figure 1:
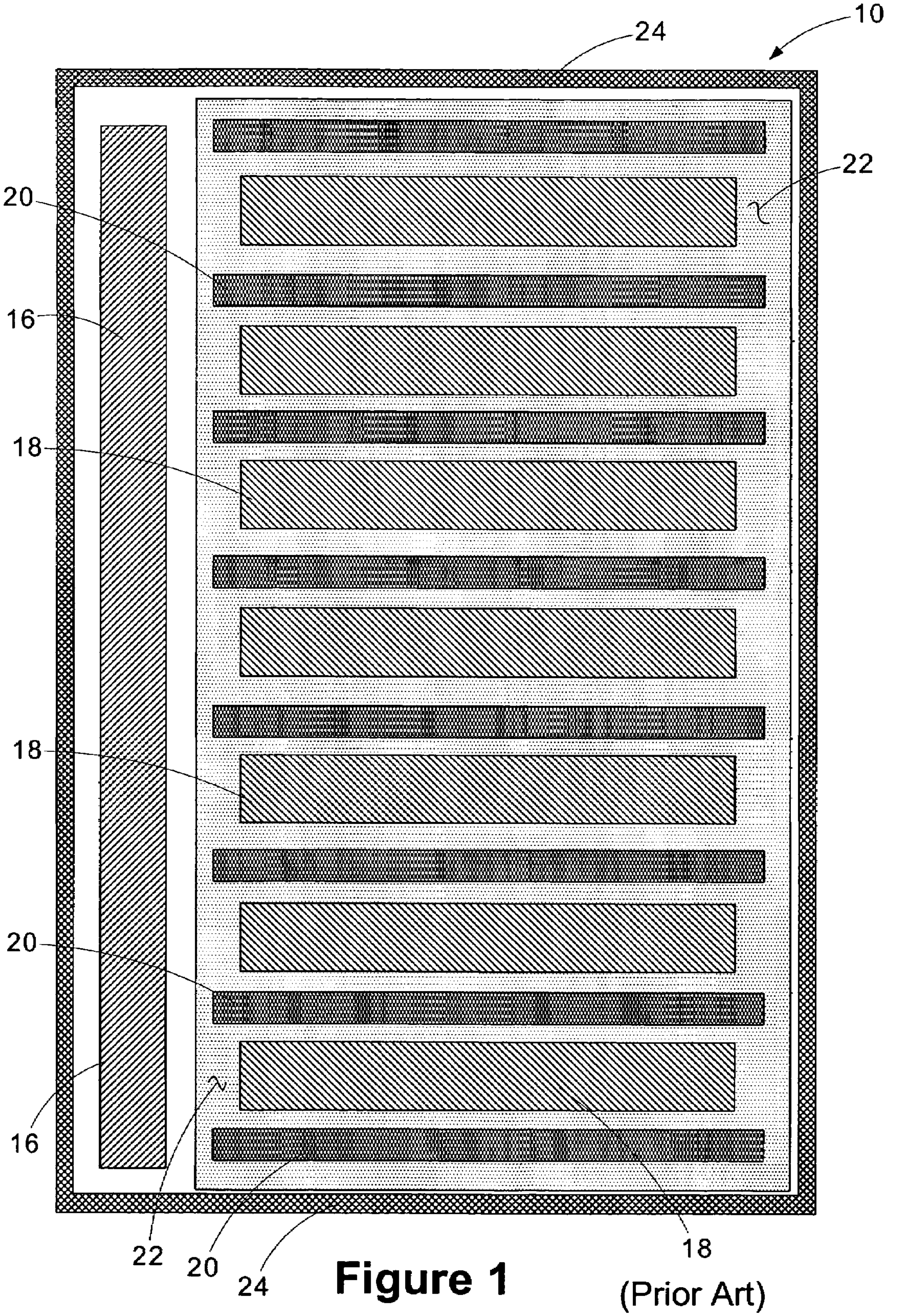
FIG. 1 depicts an illustrative layout for various doped regions on an illustrative prior art power bipolar transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various layers, doped regions and structures of the semiconductor devices are depicted in the drawings as having very precise, sharp configurations and profiles, those skilled in the art recognize that, in reality, these regions and structures may not be as precise as indicated in the drawings. Additionally, the relative sizes of the various features, regions and layers depicted in the drawings may be exaggerated or reduced as compared to the size of those features, regions or layers on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various bipolar transistor designs having a layout geometry that is optimized for device performance and enhanced packing density. As will be readily apparent to those skilled in the art upon a complete reading of the present application, the present invention may be used in connection with the formation of a variety of different semiconductor devices. Moreover, the present invention may be employed with a variety of different technologies, e.g., 80–250 volt devices. Thus, the present invention should not be considered as limited to any particular type of device or other methodologies employed in forming such a semiconductor device unless such limitations are expressly set forth in the appended claims.

Figure 2A:
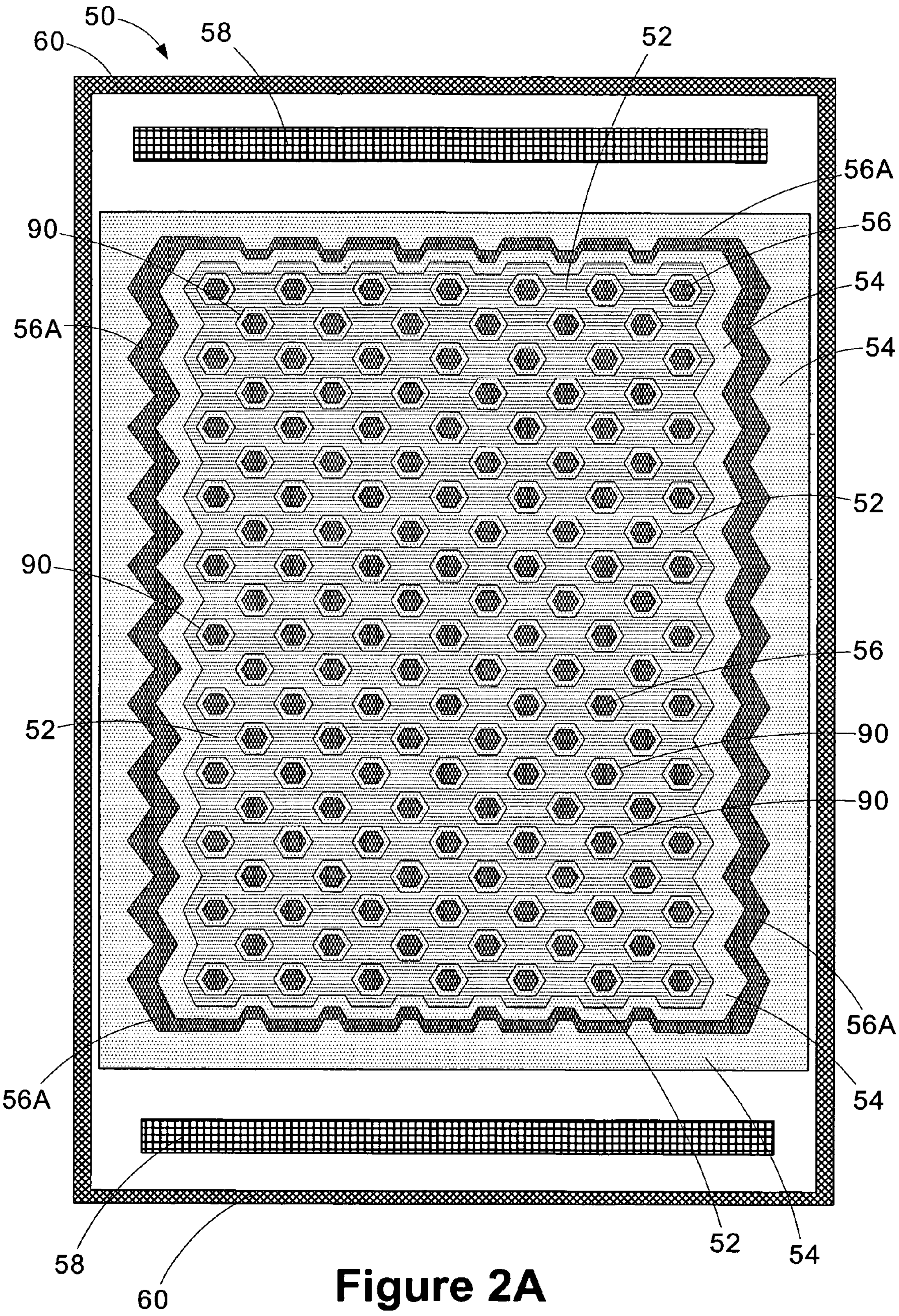
FIGS. 2A–2C are various schematic views depicting an illustrative power bipolar transistor in accordance with one illustrative embodiment of the present invention.
Figure 2B:
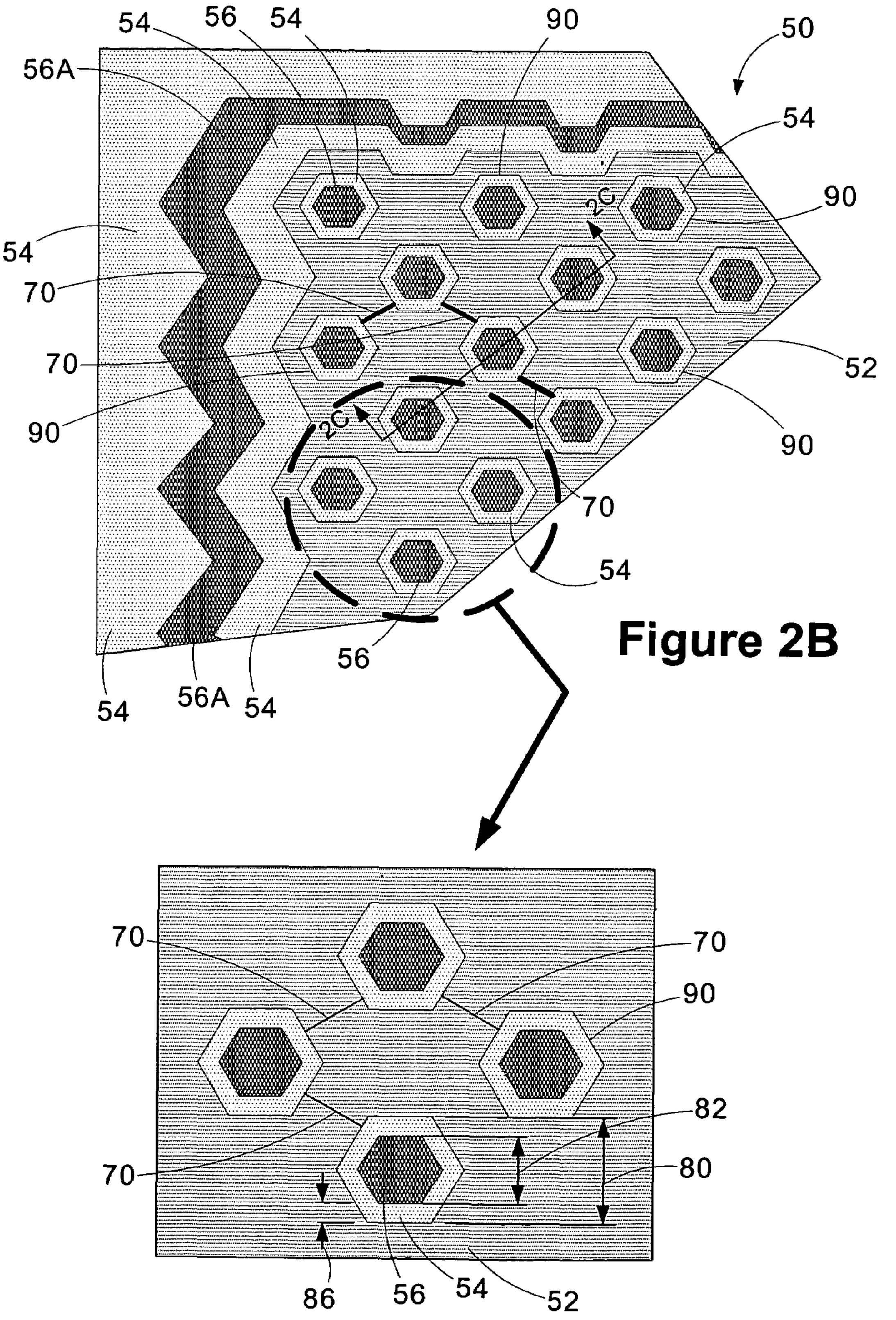
Figure 2C:
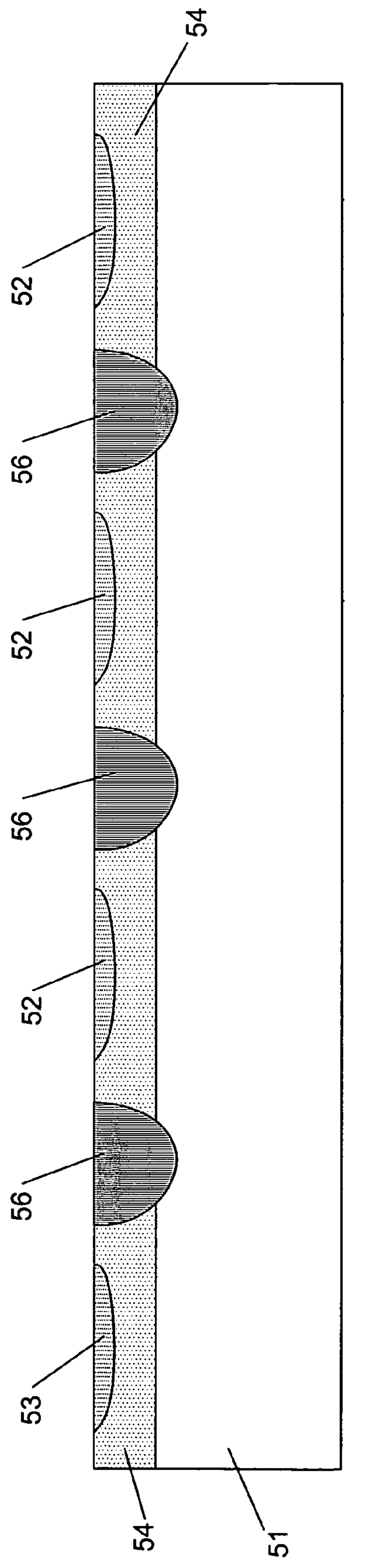

FIGS. 2A–2C schematically depict the layout geometry of various doped regions of an illustrative power bipolar transistor 50 in accordance with one illustrative embodiment of the present invention. FIG. 2A is a plan view depicting the various doped regions of the bipolar transistor 50. FIG. 2B is an enlarged plan view of a section of the device 50. FIG. 2C is a cross-sectional view of a portion of the bipolar transistor 50 taken along the line "2C—2C," as indicated in FIG. 2B. In general, the power bipolar transistor 50 is comprised of a continuous emitter region 52, an intrinsic base region 54, a plurality of extrinsic base regions 56 and a plurality of sinker regions 58. Also depicted in FIGS. 2A–2B is an extrinsic base ring 56A that extends beyond and around the perimeter of the continuous emitter region 52. The transistor 50 is surrounded by an illustrative trench isolation region 60. All of the various doped regions are formed in an active layer 51 (see FIG. 2C) of an SOI substrate. However, if desired, the present invention may be manufactured in a bulk semiconducting substrate comprised of a variety of semiconducting materials, e.g., silicon, silicon germanium, gallium arsenide, etc. Thus, the present invention should not be considered as limited to use with any particular type of semiconducting substrates nor to the basic structure of the substrate, i.e., an SOI structure versus a bulk substrate.

As will be recognized by those skilled in the art, the emitter region 52 of the power bipolar transistor 50 is a continuous doped region having a plurality of openings 90 defined therein. That is, the continuous emitter region 52 has a novel mesh-like configuration. Also note that the emitter region 52 is continuous as opposed to the discrete emitter regions 18 depicted in FIG. 1. In the depicted embodiment, the power bipolar transistor 50 also includes a plurality of extrinsic base regions 56 positioned in the areas or openings 90 defined by the continuous emitter region 52. Of course, FIGS. 2A–2C depict the power bipolar device 50 at the point of fabrication when the various doped regions have been formed to define the power bipolar device 50. Various contacts will be provided to the various doped regions as the processing of the device 50 is completed. For example, various polysilicon or metal contacts may be formed to the various doped regions in accordance with known practice. In some cases, the completed device 50 may employ polysilicon contacts to the continuous emitter region 52 wherein the polysilicon contacts are also doped so as to assist with the emitter function.

FIGS. 3A–3B and 4A–4B will be used to depict one illustrative process flow for forming one embodiment of a power bipolar transistor 50 in accordance with the present invention. As the drawings submitted herewith are directed to those skilled in the art, the drawings do not show each and every feature of an actual device so as not to obscure the disclosure of the present invention. Rather, for ease of explanation, the drawings only depict an illustrative process flow for forming the intrinsic base regions 54, the extrinsic base regions 56 and the continuous emitter region 52. Other well known techniques may be performed for forming other doped regions or structures for the completed device, e.g., collector regions, sinker implants, various contacts to the various doped regions, etc. However, the illustrative process flow described herein for forming the power bipolar transistor 50 should not be considered a limitation of the present invention.

Figure 3B:
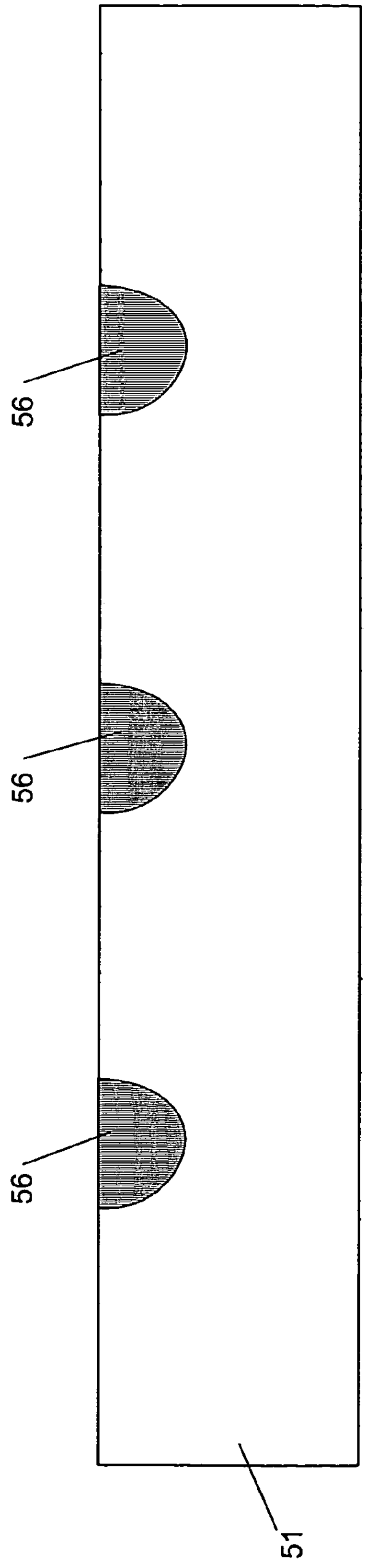
FIGS. 3A–3B are schematic views depicting one illustrative process flow for forming an intrinsic base region on a power bipolar transistor in accordance with the present invention.
Figure 3A:
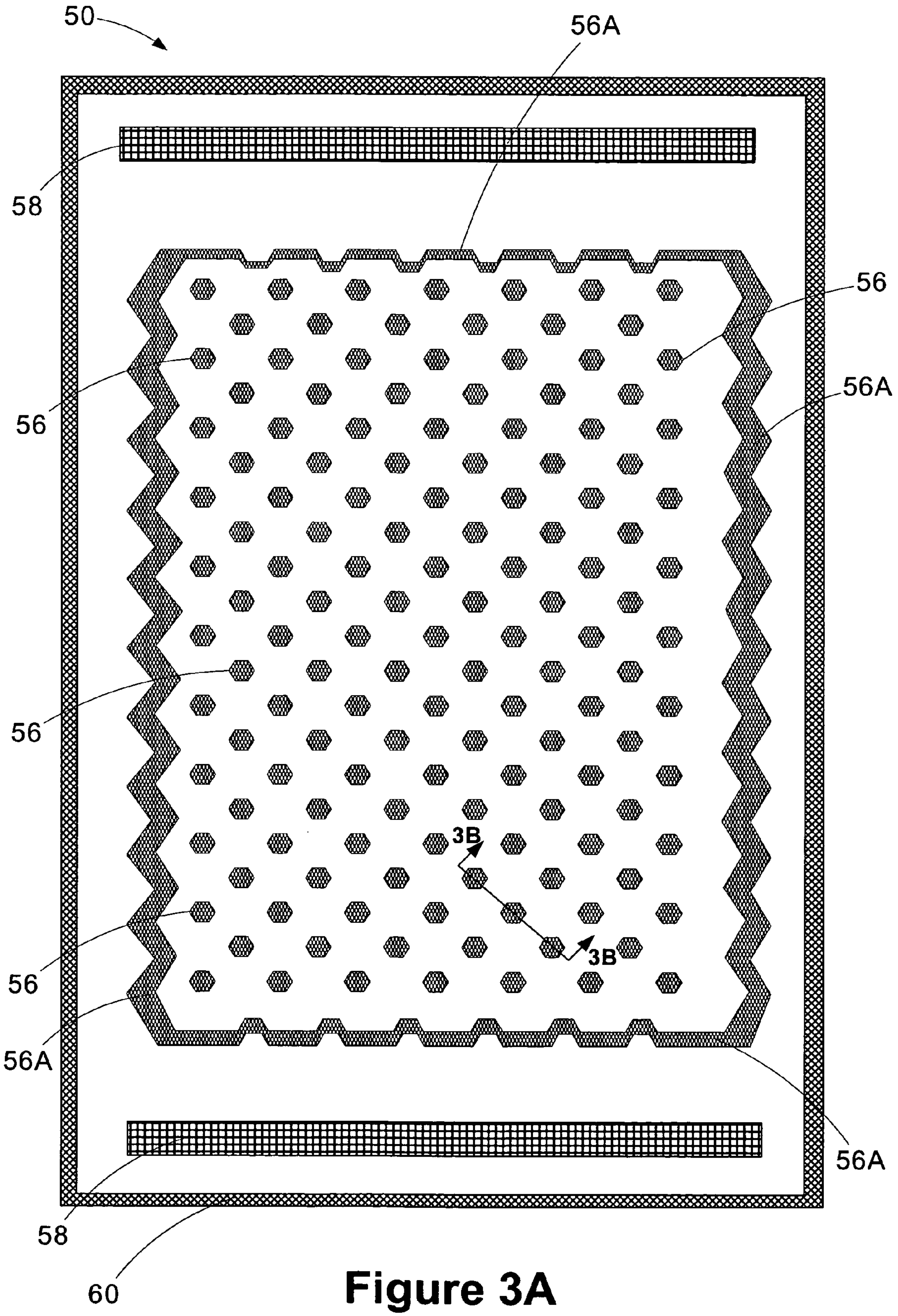

FIGS. 3A–3B are, respectively, schematic plan and cross-sectional side views of the bipolar device 50 depicting the formation of the extrinsic base regions 56. As shown therein, in one particularly illustrative embodiment, the extrinsic base regions 56 are spaced-apart regions having a generally hexagonal configuration. Other configurations are also possible for the extrinsic base regions 56, e.g., circular, square, etc. Also note that a continuous extrinsic base region 56A is formed during this process. This outer extrinsic base region 56A is configured and laid out such that it may cooperatively mesh with other components of the power bipolar transistor 50. The extrinsic base regions 56 may be formed by performing one or more implant processes using a patterned masking layer (not shown), e.g., photoresist. The dopant dose employed may vary depending upon the particular application. For example, in the case of an NPN power bipolar transistor, the extrinsic base regions 56 may be formed by performing an ion implant process with a P-type dopant material, such as boron, at a dopant dose of approximately $1E^{14}$–$1E^{15}$ ions/cm$^2$ at an energy level of approximately 55 keV.

Figure 4A:
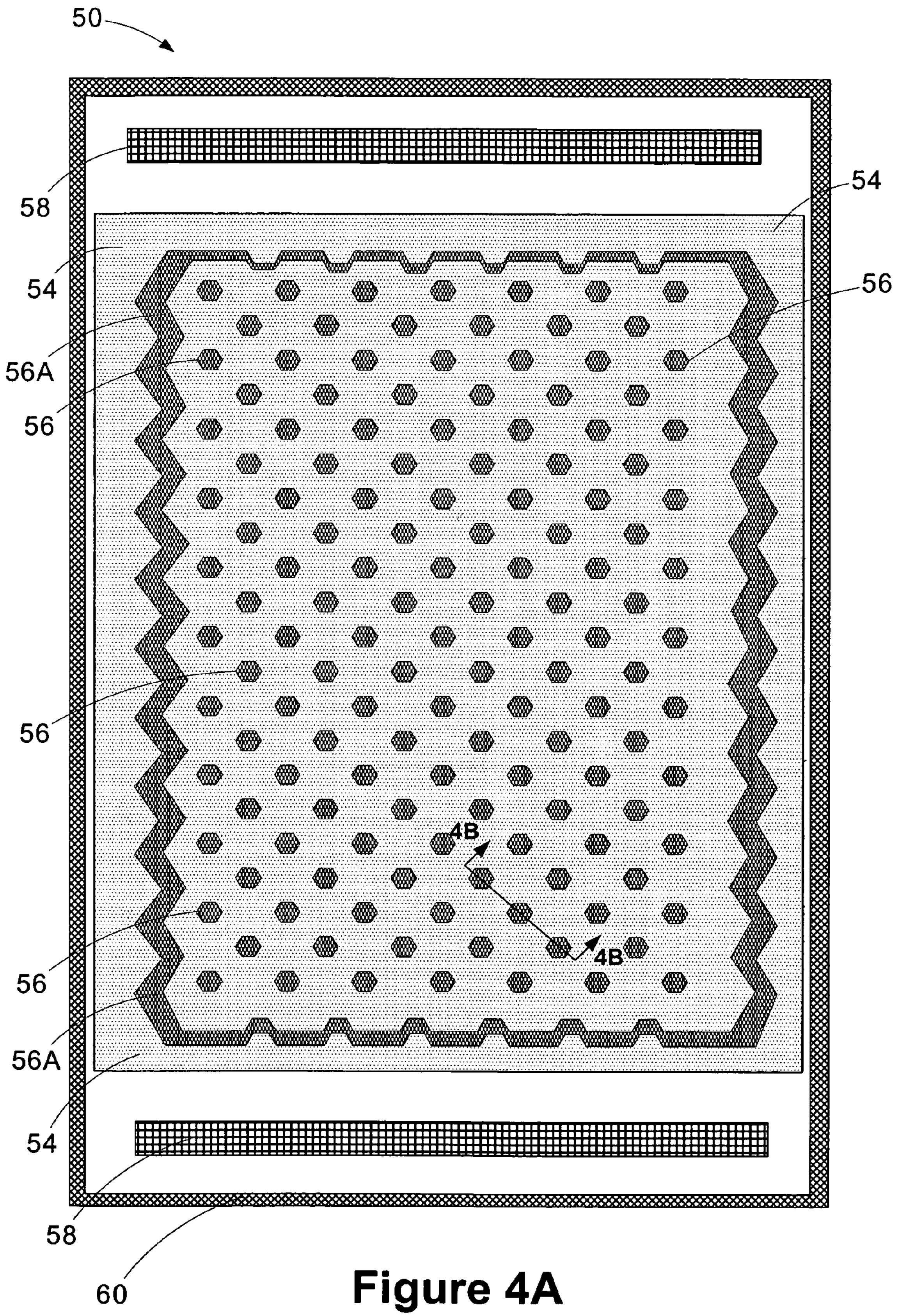
FIGS. 4A–4B are schematic views depicting one illustrative process flow for forming extrinsic base regions on a power bipolar transistor in accordance with the present invention.
Figure 4B:
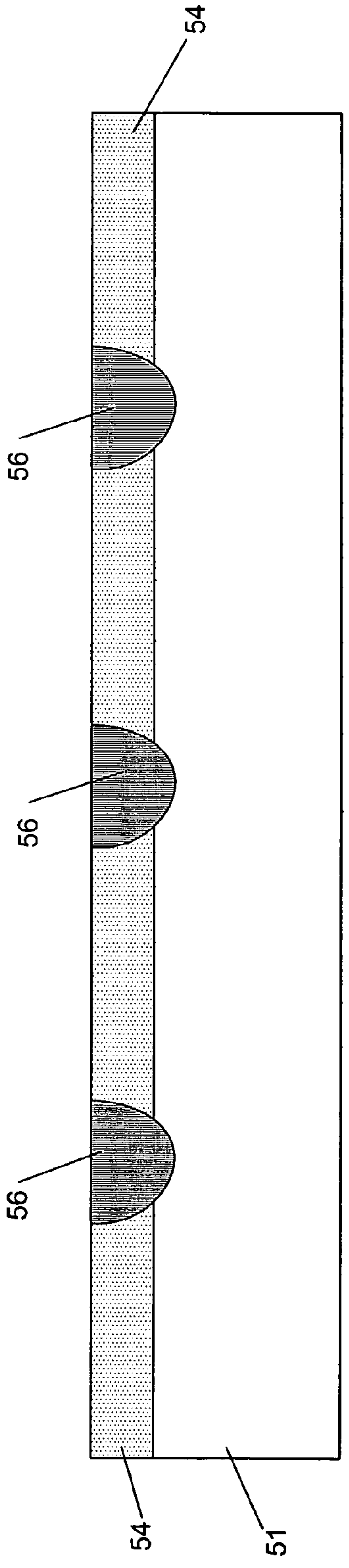

FIGS. 4A–4B are, respectively, schematic plan and cross-sectional side views of the bipolar transistor 50 depicting the formation of the intrinsic base region 54 in the active layer 51. FIG. 3A depicts the transistor 50 at the point where the trench isolation region 60, the buried collector region (not shown), and the N$^+$sinker regions 58 have been formed. The methods used to form such regions are well known to those skilled in the art. The intrinsic base region 54 may be formed by performing an ion implant process through a patterned masking layer (not shown), e.g., photoresist, in accordance with known processing techniques. The intrinsic base region 54 shown in FIGS. 3A–3B is depicted at the point of processing wherein one or more anneal processes have been performed to "drive-in" the doped region and/or to repair any lattice damage due to the ion implant processes performed on the transistor 50 to form the intrinsic base region 54. In forming the intrinsic base region 54, the dopant material used and the dopant dose may vary depending upon the particular application. In one illustrative embodiment, for an NPN bipolar device, the intrinsic base region 54 may be formed by performing an ion implant process using a P-type dopant material, e.g., boron, at a dopant dose ranging from approximately $1E^{13}$–$1E^{14}$ ions/cm$^2$ at an energy level of approximately 40 keV. As indicated in FIG. 4B, the extrinsic doped regions 56 may extend beyond the depth of the intrinsic base region 54 depending upon the particular application.

FIGS. 2A and 2C depict the formation of the continuous emitter region 52 having a plurality of openings 90 defined therein. As indicated in the illustrative embodiment depicted in FIG. 2C, the continuous emitter region 52 is formed to a depth less than that of the intrinsic base region 54. In the illustrative example where the power bipolar transistor 50 is an NPN device, the emitter region 52 may be formed by performing one or more implant processes using an N-type dopant material through a patterned masking layer (not shown). For example, in one particular embodiment, the emitter region 52 may be formed by implanting arsenic at a dopant concentration level of approximately $1E^{16}$ ions/cm$^2$ at an energy level of approximately 160 keV. Note that the emitter region 52 has a general mesh-like configuration, with a plurality of openings 90 formed therein, and that the extrinsic base regions 56 are positioned within an area defined by a hexagonally shaped openings formed in the continuous emitter region 52.

It should be understood that in referring to the configuration of a particular region, e.g., the extrinsic base regions 56, as hexagonally shaped, substantially hexagonally shaped or other geometrical terms, e.g., circular, rectangular, precise geometric precision is not intended. That is, the various doped regions described herein may be formed using traditional manufacturing tools and processes wherein such theoretical precision is not possible. Thus, the use of such terms shall be understood to include formation of such doped regions in their initial implanted condition and shall also be understood to include such doped regions in which there has been some migration of the implanted doped materials due to the performance of one or more anneal processes.

As shown in FIG. 2B, the layout of the bipolar transistor 50 is such that there is uniform emitter width 70 which provides uniform current flow paths and tends to reduce current crowding. In some embodiments, the emitter width 70 may vary from approximately 2–6 μm depending on the particular application. In one particularly illustrative embodiment, the emitter width 70 may be approximately 4 μm. In accordance with one aspect of the present invention, the mesh style emitter region 52 defines a plurality of openings 90 in each of which an extrinsic base region 56 is formed. In one particular embodiment, the openings 90 have a substantially hexagonal shaped configuration. The size of this opening 90 may vary depending upon the particular application. In the illustrative embodiment where the openings 90 have a generally hexagonal configuration, the size of the opening, or spacing 80 between the emitter regions 52 may range from approximately 6–10 μm. In one particularly illustrative embodiment, the spacing 80 may be approximately 8 μm. In the depicted embodiment, the openings 90 are configured and arranged in such a manner that the spacing 80 between emitter regions 52 is substantially uniform. The size and configuration of the extrinsic base regions 56 formed within the openings 90 defined by the continuous emitter regions 52 may also vary depending upon the particular application. For example such extrinsic base regions 56 may have a generally hexagonal shaped configured, a circular configuration, or a square or rectangular configuration. The spacing 80 may also be a function of the size dimension 82 of the extrinsic base region 56. For example, the design of the bipolar transistor 50 may be such that the space 86 between the emitter region 52 and the extrinsic base region 56 may have a minimum value. As a specific example, the dimension 80 may be determined by adding the dimension 82 of the extrinsic base region 56 and twice the minimum spacing dimension 86.

The present invention may prove beneficial in several respects. For example, the device 50 described herein may reduce or eliminate current crowding due to, among other things, the uniform distance 86 between the extrinsic base regions 56 and the emitter 52. That is, the approximately equidistant spacing between emitter regions and the uniform space between the extrinsic base and the emitter leads to more uniform current flow. Additionally, the configuration of the various doped regions described herein allows the device 50 to be more densely packed. That is, with a bipolar junction transistor of the present design, the emitter region 52 occupies a larger percentage or fraction of the total silicon area as compared to the illustrative multiple stripe bipolar transistor. As a result, less silicon area is consumed as compared to prior art multiple stripe type bipolar junction transistors without sacrificing emitter current density. In one particular example, a bipolar junction transistor employing the layout geometry described herein resulted in an approximately 45% reduction in silicon area for an NPN device and approximately 23% reduction in silicon area for a PNP device, as compared to a bipolar junction transistor with a traditional multiple stripe layout geometry. These results (simulations?) were obtained based on an 80V design application. The difference in the relative savings in silicon area between the NPN and PNP design is due to a variety of factors, such as, for example, the mobility characteristics of electrons versus holes.

The present invention is generally directed to various embodiments of a bipolar transistor with the geometry optimized for device performance and various methods of making same. In one illustrative embodiment, the device comprises a substrate, an intrinsic base region formed in the substrate, a continuous emitter region formed within the intrinsic base region, the emitter region having a plurality of substantially hexagonal shaped openings defined therein, and a plurality of extrinsic base regions formed in the substrate, wherein each of the extrinsic base regions is positioned within an area defined by one of the plurality of substantially hexagonal shaped openings.

In another illustrative embodiment, the device comprises a substrate, an intrinsic base region formed in the substrate, a continuous emitter region formed within the intrinsic base region, the emitter region having a plurality of substantially hexagonal shaped openings defined therein, a plurality of substantially hexagonal shaped extrinsic base regions formed in the substrate, wherein each of the substantially hexagonal shaped extrinsic base regions is positioned within an area defined by one of the plurality of substantially hexagonal shaped openings, and at least one conductive contact coupled to the continuous emitter region.

In yet another illustrative embodiment, the device comprises a substrate, an intrinsic base region formed in the substrate, a continuous emitter region formed within the intrinsic base region, the emitter region having a plurality of substantially hexagonal shaped openings defined therein, the continuous emitter region having an approximately constant width between each of the plurality of substantially hexagonal shaped openings, and a plurality of substantially hexagonal shaped extrinsic base regions formed in the substrate, wherein each of the substantially hexagonal shaped extrinsic base regions is positioned within an area defined by one of the plurality of substantially hexagonal shaped openings.

In one illustrative embodiment, the method comprises forming a plurality of extrinsic base regions in a substrate, forming an intrinsic base region in the substrate and forming a continuous emitter region within the intrinsic base region, the emitter region having a plurality of substantially hexagonal shaped openings defined therein, wherein the continuous emitter region is formed such that each of the extrinsic base regions is positioned within an area defined by one of the plurality of substantially hexagonal shaped openings.

In another illustrative embodiment, the method comprises forming a plurality of substantially hexagonal shaped extrinsic base regions in a substrate, forming an intrinsic base region in the substrate and forming a continuous emitter region within the intrinsic base region, the emitter region having a plurality of substantially hexagonal shaped openings defined therein and an approximately constant width between each of the plurality of substantially hexagonal openings, wherein the emitter region is formed such that each of the substantially hexagonal shaped extrinsic base regions is positioned within an area defined by one of the plurality of substantially hexagonal shaped openings.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A bipolar junction transistor, comprising:

a substrate;

an intrinsic base region formed in said substrate;

a continuous emitter region formed within said intrinsic base region, said emitter region having a plurality of substantially hexagonal shaped openings defined therein; and a plurality of extrinsic base regions formed in said substrate, wherein each of said extrinsic base regions is positioned within an area defined by one of said plurality of substantially hexagonal shaped openings.

2. The device of claim 1, further comprising at least one conductive contact coupled to said continuous emitter region and at least one conductive conduct coupled to each of said plurality of extrinsic base regions.

3. The device of claim 1, further comprising an extrinsic base ring formed in said substrate around said continuous emitter region, at least a portion of said intrinsic base region being positioned between said continuous emitter region and said extrinsic base ring.

4. The device of claim 1, wherein said bipolar junction transistor is a power bipolar junction transistor.

5. The device of claim 1, wherein said continuous emitter region has an approximately constant width between each of said plurality of substantially hexagonal openings.

6. The device of claim 1, wherein said bipolar junction transistor is an NPN bipolar junction transistor.

7. The device of claim 1, wherein said bipolar junction transistor is a PNP bipolar junction transistor.

8. The device of claim 1, wherein each of said plurality of extrinsic base regions has a substantially hexagonal shape.

9. The device of claim 1, wherein said substrate is an active layer of an SOI substrate.

10. The device of claim 1, wherein said substrate is a bulk semiconducting material.

11. The device of claim 1, wherein said extrinsic base regions extend below said intrinsic base region.

12. A bipolar junction transistor, comprising:

a substrate;

an intrinsic base region formed in said substrate;

a continuous emitter region formed within said intrinsic base region, said emitter region having a plurality of substantially hexagonal shaped openings defined therein;

a plurality of substantially hexagonal shaped extrinsic base regions formed in said substrate, wherein each of said substantially hexagonal shaped extrinsic base regions is positioned within an area defined by one of said plurality of substantially hexagonal shaped openings; and at least one conductive contact coupled to said continuous emitter region.

13. The device of claim 12, further comprising an extrinsic base ring formed in said substrate around said continuous emitter region, at least a portion of said intrinsic base region being positioned between said continuous emitter region and said extrinsic base ring.

14. The device of claim 12, wherein said bipolar junction transistor is a power bipolar junction transistor.

15. The device of claim 12, wherein said continuous emitter region has an approximately constant width between each of said plurality of substantially hexagonal openings.

16. The device of claim 12, wherein said bipolar transistor is an NPN bipolar junction transistor.

17. The device of claim 12, wherein said bipolar transistor is a PNP bipolar junction transistor.

18. The device of claim 12, wherein said substrate is an active layer of an SOI substrate.

19. The device of claim 12, wherein said substrate is a bulk semiconducting material.

20. The device of claim 12, wherein said extrinsic base regions extend below said intrinsic base region.

21. A bipolar junction transistor, comprising:

a substrate;

an intrinsic base region formed in said substrate;

a continuous emitter region formed within said intrinsic base region, said emitter region having a plurality of substantially hexagonal shaped openings defined therein, said continuous emitter region having an approximately constant width between each of said plurality of substantially hexagonal shaped openings; and a plurality of substantially hexagonal shaped extrinsic base regions formed in said substrate, wherein each of said substantially hexagonal shaped extrinsic base regions is positioned within an area defined by one of said plurality of substantially hexagonal shaped openings.

22. The device of claim 21, further comprising an extrinsic base ring formed in said substrate around said continuous emitter region, at least a portion of said intrinsic base region being positioned between said continuous emitter region and said extrinsic base ring.

23. The device of claim 21, wherein said bipolar junction transistor is a power bipolar junction transistor.

* * * * *